United States Patent
Babu et al.

(10) Patent No.: US 12,080,522 B2
(45) Date of Patent: Sep. 3, 2024

(54) PRECLEAN CHAMBER UPPER SHIELD WITH SHOWERHEAD

(71) Applicant: APPLIED MATERIALS, INC., Santa Clara, CA (US)

(72) Inventors: Sarath Babu, Singapore (SG); Ananthkrishna Jupudi, Singapore (SG); Yueh Sheng Ow, Singapore (SG); Junqi Wei, Singapore (SG); Kelvin Tai Ming Boh, Singapore (SG); Kang Zhang, Singapore (SG); Yuichi Wada, Chiba (JP)

(73) Assignee: APPLIED MATERIALS, INC., Santa Clara, CA (US)

( * ) Notice: Subject to any disclaimer, the term of this patent is extended or adjusted under 35 U.S.C. 154(b) by 538 days.

(21) Appl. No.: 16/855,559

(22) Filed: Apr. 22, 2020

(65) Prior Publication Data

US 2021/0335581 A1    Oct. 28, 2021

(51) Int. Cl.
H01J 37/32        (2006.01)

(52) U.S. Cl.
CPC .... *H01J 37/32495* (2013.01); *H01J 37/3244* (2013.01); *H01J 37/32513* (2013.01); *H01J 37/32642* (2013.01); *H01J 37/32651* (2013.01)

(58) Field of Classification Search
CPC ............ C23C 16/4404; C23C 16/4409; C23C 16/45565; H01J 37/3244; H01J 37/32495; H01J 37/32513; H01J 37/32642; H01J 37/32651; H01J 2237/0268
See application file for complete search history.

(56) References Cited

U.S. PATENT DOCUMENTS

| | | |
|---|---|---|
| 5,762,748 A | 6/1998 | Banholzer |
| 6,349,670 B1 | 2/2002 | Nakano et al. |
| 6,436,193 B1 | 8/2002 | Kasai et al. |

(Continued)

FOREIGN PATENT DOCUMENTS

| | | |
|---|---|---|
| JP | H11251094 A | 9/1999 |
| TW | D198930 | 8/2019 |

(Continued)

OTHER PUBLICATIONS

Search Report for Taiwan Design Application No. 109305849, dated Mar. 29, 2021.

(Continued)

*Primary Examiner* — Benjamin Kendall
(74) *Attorney, Agent, or Firm* — MOSER TABOA

(57) ABSTRACT

Embodiments of process kits for use in a process chamber are provided herein. In some embodiments, a process kit for use in a process chamber, includes: a top plate having a central recess disposed in an upper surface thereof; a channel extending from an outer portion of the top plate to the central recess; a plurality of holes disposed through the top plate from a bottom surface of the recess to a lower surface of the top plate; a cover plate configured to be coupled to the top plate and to form a seal along a periphery of the central recess such that the covered recess forms a plenum within the top plate; and a tubular body extending down from the lower surface of the top plate and surrounding the plurality of holes, the tubular body further configured to surround a substrate support.

19 Claims, 3 Drawing Sheets

(56) References Cited

U.S. PATENT DOCUMENTS

| | | | |
|---|---|---|---|
| D557,425 S | 12/2007 | Nakamura et al. | |
| 7,981,262 B2 | 7/2011 | Pavloff et al. | |
| D642,605 S | 8/2011 | Ishikawa et al. | |
| D703,160 S | 4/2014 | Tanimura | |
| D734,730 S | 7/2015 | Yoshida et al. | |
| D789,310 S | 6/2017 | Kusakabe et al. | |
| 9,728,380 B2 | 8/2017 | Mohn et al. | |
| D802,790 S | 11/2017 | Tauchi et al. | |
| D804,436 S | 12/2017 | Tauchi et al. | |
| 9,865,437 B2 | 1/2018 | Chia et al. | |
| D827,592 S | 9/2018 | Ichino et al. | |
| 10,577,689 B2 | 3/2020 | Subramani et al. | |
| D891,382 S | 7/2020 | Koppa et al. | |
| D913,979 S | 3/2021 | Babu et al. | |
| D933,725 S | 10/2021 | Koppa et al. | |
| D940,765 S | 1/2022 | Gunther et al. | |
| D941,371 S | 1/2022 | Lavitsky et al. | |
| D941,372 S | 1/2022 | Gunther et al. | |
| D942,516 S | 2/2022 | Koppa et al. | |
| D946,638 S | 3/2022 | Riker et al. | |
| 2004/0149216 A1 | 8/2004 | Osada et al. | |
| 2007/0034337 A1* | 2/2007 | Nishimoto | H01J 37/32532 156/345.43 |
| 2007/0082507 A1 | 4/2007 | Iyer et al. | |
| 2007/0209759 A1* | 9/2007 | Miya | H01J 37/3244 156/345.35 |
| 2009/0188625 A1* | 7/2009 | Carducci | H01J 37/32467 156/345.1 |
| 2010/0291319 A1 | 11/2010 | Yamashita et al. | |
| 2011/0146571 A1* | 6/2011 | Bartlett | C23C 16/4401 118/667 |
| 2012/0305190 A1 | 12/2012 | Kang et al. | |
| 2016/0111256 A1* | 4/2016 | Stowell | H01J 37/32009 137/561 A |
| 2021/0335581 A1 | 10/2021 | Babu et al. | |
| 2022/0223367 A1 | 7/2022 | Savandaiah et al. | |

FOREIGN PATENT DOCUMENTS

| | | |
|---|---|---|
| TW | D198931 | 8/2019 |
| WO | WO 2012/063779 | 5/2012 |

OTHER PUBLICATIONS

PCT International Search Report and Written Opinion for PCT/US2021/027957 dated Aug. 6, 2021.

* cited by examiner

PRECLEAN CHAMBER UPPER SHIELD WITH SHOWERHEAD

FIELD

Embodiments of the present disclosure generally relate to substrate processing equipment and, more specifically, to process kits for use in substrate processing equipment.

BACKGROUND

Process chambers configured to perform a preclean process are known. For example, such chambers are configured to remove native oxide on metal contact pads of a substrate prior to physical vapor deposition (PVD) for depositing one or more barrier layers, e.g., titanium (Ti), copper (Cu), etc., on the substrate and to remove other materials. Preclean chambers, typically, use ion bombardment (induced by RF plasma) to remove the native oxide on the metal contact pads and other materials. For example, the preclean process can etch the native oxide and material from the substrate. The preclean process is configured to lower contact resistance between the metal contacts on the substrate to enhance performance and power consumption of integrated circuits on the substrate and to promote adhesion.

To perform a plasma cleaning process, substrate comprising an integrated circuit is placed in a plasma chamber and a pump removes most of the air from the chamber. Electromagnetic energy (e.g., radio frequency) is applied to an injected gas, such as argon, to excite the injected gas into a plasma state. The plasma releases ions that bombard the surface of the substrate to remove contaminants and/or material from the substrate. Atoms or molecules of the contaminants and/or substrate material are etched from the substrate and are, for the most part, pumped out of the chamber. However, some of the contaminant and/or etched material may be deposited on surfaces of the chamber. Process kits are typically used to reduce or prevent deposition of contaminants and/or etched materials onto surfaces of the chamber. However, process kits may interfere with providing uniform flow of process gas into the plasma chamber.

Accordingly, the inventors have provided embodiments of improved process kits.

SUMMARY

Embodiments of process kits for use in a process chamber are provided herein. In some embodiments, a process kit for use in a process chamber, includes: a top plate having a central recess disposed in an upper surface thereof; a channel extending from an outer portion of the top plate to the central recess; a plurality of holes disposed through the top plate from a bottom surface of the recess to a lower surface of the top plate; a cover plate configured to be coupled to the top plate and to form a seal along a periphery of the central recess such that the covered recess forms a plenum within the top plate; and a tubular body extending down from the lower surface of the top plate and surrounding the plurality of holes, the tubular body further configured to surround a substrate support, wherein a gas flow path extends from the channel to the plenum, through the plurality of holes, and into a volume within the tubular body.

In some embodiments, a process kit for use in a process chamber, includes: a top plate having a central recess disposed in an upper surface thereof; a channel extending from an outer portion of the top plate to the central recess; a plurality of holes disposed through the top plate from a bottom surface of the central recess to a lower surface of the top plate, wherein the plurality of holes are arranged along a plurality of concentric circles; and a tubular body extending down from the lower surface of the top plate and surrounding the plurality of holes, the tubular body further configured to surround a substrate support, wherein sidewalls of the tubular body do not include any through holes, and wherein a gas flow path extends from the channel to the central recess, through the plurality of holes, and into a volume within the tubular body.

In some embodiments, a process kit for use in a process chamber includes a tubular body configured to surround a substrate support; and a top plate coupled to an upper end of the tubular body, wherein the top plate includes a countersink and a central opening disposed in the counter sink and extending through the top plate, wherein the top plate includes an upper portion and a lower portion, and wherein the upper portion extends radially outward of the lower portion and an outer surface of the lower portion is coplanar with an outer surface of the tubular body.

In some embodiments, a process chamber, includes: a chamber body defining an interior volume and having a pump port; an adapter disposed on sidewalls of the chamber body; a substrate support disposed in the interior volume; an upper shield having a plenum therein, a channel extending from an outer portion of the upper shield to the plenum, a plurality of holes disposed through the upper shield from the plenum to a lower surface of the upper shield, and a tubular body extending down from the lower surface, wherein the tubular body is disposed about the substrate support; and a pump coupled to the pump port and configured to remove particles from the interior volume through a gap between the tubular body and the substrate support.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
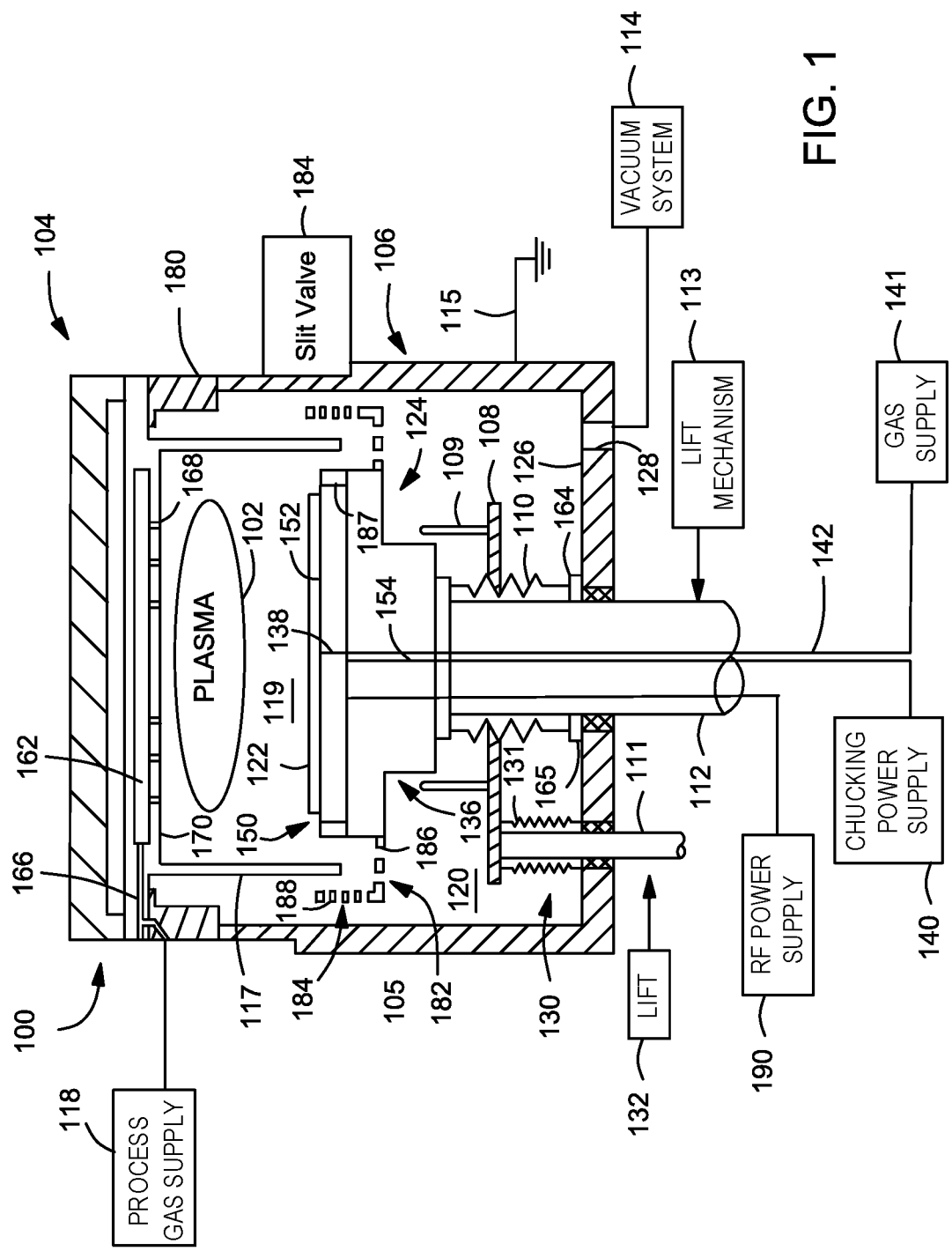
FIG. 1 depicts a schematic side view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kits for use in a process chamber are provided herein. The process chamber may be configured to perform any suitable process to a substrate. In some embodiments, the process chamber is configured to perform an etch process, a deposition process, or a preclean process. The process chamber includes a substrate support to support the substrate. A pump may be coupled to the process chamber to remove particles from an interior volume of the process chamber. A process kit is disposed about the substrate support and includes an upper shield that advantageously is configured to shield chamber components from unwanted materials and is configured to act as a showerhead to provide one or more process gases to a processing volume between the upper shield and the substrate support. The process kit is also configured to provide a high conductance of flow through the process kit.

FIG. 1 depicts a schematic side view of a process chamber (e.g., a plasma processing chamber) having a process kit in accordance with at least some embodiments of the present disclosure. In some embodiments, the plasma processing chamber is a preclean processing chamber. However, other types of process chambers configured for different processes can also use or be modified for use with embodiments of the process kit described herein.

The chamber 100 is a vacuum chamber which is suitably adapted to maintain sub-atmospheric pressures within an interior volume 120 during substrate processing. In some embodiments, the chamber 100 can maintain a pressure of about 1.0 mTorr to about 25.0 mTorr. The chamber 100 includes a chamber body 106 covered by lid 104 which encloses a processing volume 119 located in the upper half of the interior volume 120. In some embodiments, an adapter 180 rests on sidewalls of the chamber body 106 between the chamber body 106 and the lid 104. The chamber body 106 and the adapter 180 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise a pedestal 136 and a hollow support shaft 112 for supporting the pedestal 136. The pedestal 136 includes an electrostatic chuck 150 having one or more chucking electrodes embedded therein. In some embodiments, the electrostatic chuck 150 comprises a dielectric plate. The hollow support shaft 112 provides a conduit to provide, for example, backside gases, process gases, fluids, coolants, power, or the like, to the electrostatic chuck 150. In some embodiments, the substrate support 124 includes an edge ring 187 disposed about the electrostatic chuck 150 to enhance process uniformity at an edge of the substrate 122. In some embodiments, the edge ring 187 is made of alumina ($Al_2O_3$). A slit valve 134 may be coupled to the chamber body 106 to facilitate transferring the substrate 122 into and out of the interior volume 120.

In some embodiments, the hollow support shaft 112 is coupled to a lift mechanism 113, such as an actuator or motor, which provides vertical movement of the electrostatic chuck 150 between an upper, processing position, and a lower, transfer position. A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while reducing or preventing loss of vacuum from within the chamber 100. The bellows assembly 110 also includes a lower bellows flange 164 in contact with an o-ring 165 or other suitable sealing element which contacts the bottom surface 126 to help prevent loss of chamber vacuum.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The electrostatic chuck 150 may include thru-holes to receive the lift pins 109. A bellows assembly 131 is coupled between the substrate lift 130 and bottom surface 126 to provide a flexible seal which maintains the chamber vacuum during vertical motion of the substrate lift 130.

The hollow support shaft 112 provides a conduit for coupling a backside gas supply 141, a chucking power supply 140, and a RF power supply 190 to the electrostatic chuck 150. In some embodiments, the chucking power supply 140 provides DC power to the electrostatic chuck 150 via conduit 154 to retain the substrate 122. In some embodiments, RF energy supplied by the RF power supply 190 may have a frequency of about 10 MHz or greater. In some embodiments, the RF power supply 190 may have a frequency of about 13.56 MHz.

In some embodiments, the backside gas supply 141 is disposed outside of the chamber body 106 and supplies gas to the electrostatic chuck 150. In some embodiments, the electrostatic chuck 150 includes a gas channel 138 extending from a lower surface of the electrostatic chuck 150 to an upper surface 152 of the electrostatic chuck 150. The gas channel 138 is configured to provide backside gas, such as nitrogen (N), argon (Ar), or helium (He), to the upper surface 152 of the electrostatic chuck 150 to act as a heat transfer medium. The gas channel 138 is in fluid communication with the backside gas supply 141 via gas conduit 142 to control the temperature and/or temperature profile of the substrate 122 during use. For example, the backside gas supply 141 can supply gas to cool the substrate 122 during use.

The chamber 100 includes a process kit circumscribing various chamber components to prevent unwanted reaction between such components and etched material and other contaminants. The process kit includes an upper shield 117. The upper shield 117 may be made of metal, such as aluminum. In some embodiments, the upper shield 117 rests on the adapter 180 or sidewalls of the chamber body 106. The chamber 100 is also coupled to and in fluid communication with a process gas supply 118 which may supply one or more process gases to the chamber 100 for processing a substrate disposed therein. The upper shield 117 includes a gas flow path to direct flow from the process gas supply 118 to the processing volume 119. In some embodiments, the gas flow path extends from the process gas supply 118 to the upper shield 117 through the adapter 180. In some embodiments, the gas flow path extends from the process gas supply 118 to the upper shield 117 without extending through the adapter 180. In some embodiments, the process gas supply 118 provides argon (Ar) gas.

The upper shield 117 includes a plenum 162 therein and a channel 166 extending from an outer portion of the upper shield 117 to the plenum 163. The upper shield 117 includes a plurality of holes 169 from the plenum 162 to a lower surface 170 of the upper shield 117. In some embodiments, the upper shield 117 includes a tubular body extending down from the lower surface 170 and disposed about the substrate support 124.

In some embodiments, the process kit includes a lower shield 105 circumscribing the substrate support 124. In some embodiments, the lower shield 105 is coupled to a grounded portion of the pedestal 136. In some embodiments, the lower shield 105 is made of metal such as aluminum. In some embodiments, the lower shield 105 comprises an annular ring 182 that surrounds the substrate support 124 and an annular lip 184 that extends upward from the annular ring 182. In some embodiments, the annular lip 184 extends substantially perpendicularly from the annular ring 182. In some embodiments, one or more metal straps (not shown) are disposed between the upper shield 117 and the lower shield 105 to advantageously ground the upper shield 117 to a lower shield 105 that is grounded.

The annular ring 182 includes a plurality of ring slots 186 extending through the annular ring 246. In some embodiments, the plurality of ring slots 186 are disposed at regular intervals along the annular ring 182. In some embodiments, the plurality of ring slots 186 includes a plurality of first ring slots and a plurality of second ring slots disposed radially outward of the plurality of first ring slots. In some embodiments, the annular lip 184 includes a plurality of lip slots 188 extending through the annular lip 184. In some embodiments, the plurality of lip slots 188 are disposed at regular intervals along the annular lip 184. In some embodiments, the plurality of lip slots 188 include a plurality of rows, where the plurality of lip slots 188 are arranged along each of the plurality of rows. For example, the plurality of lip slots 188 may include a lower row proximate the annular ring 182, an upper row proximate an upper surface of the annular lip 184, and a central row disposed between the upper row and the lower row.

The plurality of ring slots 186 and the plurality of lip slots 188 are advantageously sized to provide increased conductance therethrough while minimizing plasma leak through the slots. As such, the plurality of ring slots 186 are sized based on pressure in the interior volume 120, temperature in the interior volume 120, and a frequency of the RF power provided to the chamber 100, for example via RF power supply 190. A pump port 128 is configured to facilitate removal of particles from the interior volume 120 through the plurality of ring slots 186 and the plurality of lip slots 188 of the lower shield 105.

The chamber 100 is coupled to and in fluid communication with a vacuum system 114 which includes a throttle valve (not shown) and pump (not shown) which are used to exhaust the chamber 100. In some embodiments, the vacuum system 114 is coupled to the pump port 128 disposed on the bottom surface 126 of the chamber body 106. The pump port 128 facilitates removal of particles from the interior volume 120 through a gap between the upper shield 117 and the substrate support 124. The pressure inside the chamber 100 may be regulated by adjusting the throttle valve and/or vacuum pump. In some embodiments, the pump has a flow rate of about 1900 liters per second to about 3000 liters per second.

In operation, for example, a plasma 102 may be created in the interior volume 120 to perform one or more processes. The plasma 102 may be created by coupling power from a plasma power source (e.g., RF power supply 190) to a process gas via the electrostatic chuck 150 to ignite the process gas and create the plasma 102. The RF power supply 190 is also configured to attract ions from the plasma towards the substrate 122. The upper shield 117 is configured to confine the plasma 102 during use.

Figure 2A:
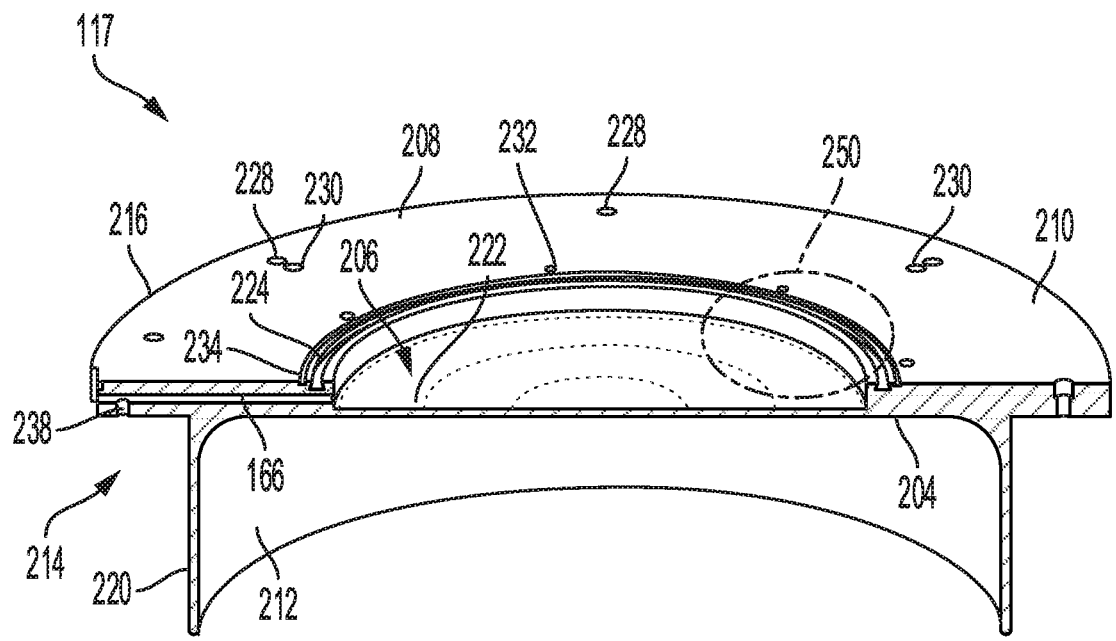
FIG. 2A depicts a top isometric cross-sectional view of an upper shield in accordance with at least some embodiments of the present disclosure.

FIG. 2A depicts an isometric cross-sectional view of the upper shield 117 in accordance with at least some embodiments of the present disclosure. The upper shield 117 generally includes a top plate 210 and a tubular body 220 extending down from a lower surface 204 of the top plate 210. In some embodiments, the upper shield 117 includes a radius at an interface between the top plate 210 and the tubular body 220. The tubular body 220 has an inner surface 212 that is configured to surround the substrate support 124. The inner surface 212 of the tubular body 220 and the lower surface 204 of the top plate 210 at least partially define the processing volume 119. In some embodiments, sidewalls of the tubular body 220 do not include any through holes. In some embodiments, the top plate 210 is circular in shape. In some embodiments, the top plate 210 has an outer diameter that is greater than an outer diameter of the tubular body 220. In some embodiments, the tubular body 220 extends straight down from the top plate 210. In some embodiments, an outer diameter of the tubular body 220 is less than an inner diameter of the annular lip 184 such that the annular lip 184 is disposed about the tubular body 220. In some embodiments, an inner diameter of the tubular body 220 is about 15.0 inches to about 19.0 inches. In some embodiments, an outer diameter of the top plate 210 is about 22.0 inches to about 25.0 inches.

In some embodiments, the top plate 210 includes a central recess 206 disposed in an upper surface 208 thereof. In some embodiments, the top plate 210 includes the channel 166 extending from an outer portion 214 of the top plate 210 to the central recess 206. In some embodiments, the channel 166 extends from an outer sidewall 216 of the top plate 210. In some embodiments, the channel 166 extends horizontally from the outer sidewall 216 to the central recess 206. In some embodiments, a gas flow path extends from process gas supply 118 to the channel 166 at the outer sidewall 216 to the central recess 206. In some embodiments a second channel 238 extends from the lower surface 204 of the top plate 210 to the channel 166 and the channel 116 is plugged at the outer sidewall 216 of the top plate 210. The second channel 238 is fluidly coupled to a channel in the adapter 180 configured to flow process gas from the process gas supply 118 through the adapter 180 and into the second channel 238.

The top plate 210 includes the plurality of holes 168 extending from a bottom surface 222 of the central recess 206 to the lower surface 204 of the top plate. The tubular body 220 surrounds the plurality of holes 168 to confine process gas from the process gas supply 118 as the gas flows through the plurality of holes 168 and into a volume within the tubular body 220. In some embodiments, the upper surface 208 of the top plate 210 includes a first annular recess 224 disposed radially outward of the central recess 206 to accommodate an o-ring 310. In some embodiments, the upper surface 208 includes a second annular recess 234 radially outward of the central recess 206 to accommodate an RF gasket 320. In some embodiments, the second annular recess 234 is disposed radially outward of the first annular recess 224.

In some embodiments, the top plate 210 includes a plurality of mounting holes 228 configured to mount the top plate 210 to the adapter 180 or chamber body 106. In some embodiments, the plurality of mounting holes 228 are disposed radially outward of the first annular recess 224. In some embodiments, the top plate 210 includes a plurality of lid mounting holes 230 configured to mount the top plate 210 to the lid 104. In some embodiments, the plurality of lid mounting holes 230 are disposed radially inward of the plurality of mounting holes 228. In some embodiments, the top plate 210 includes a plurality of cover plate holes 232 configured to mount a cover plate 302 (see FIG. 3) to the top plate 210.

Figure 2B:
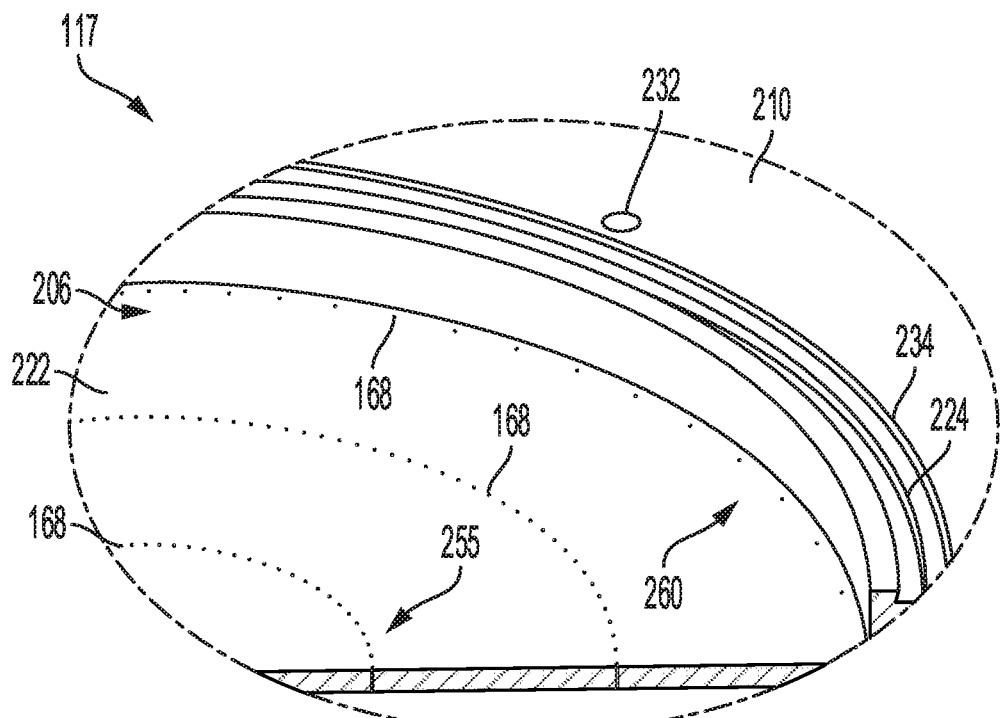
FIG. 2B depicts an enlarged view of the upper shield of FIG. 2A in accordance with at least some embodiments of the present disclosure.

FIG. 2B depicts an enlarged view 250 of the upper shield 117 of FIG. 2A in accordance with at least some embodiments of the present disclosure. In some embodiments, the plurality of holes 168 are arranged along a plurality of concentric circles. In some embodiments, the plurality of holes 168 are arranged along three concentric circles. In some embodiments, a radially innermost concentric circle 255 has a diameter of about 3.0 inches to about 5.0 inches. In some embodiments, a radially outermost concentric circle 260 has a diameter of about 10.0 inches to about 13.0 inches. In some embodiments, each one of the plurality of holes 168 have a similar diameter. In some embodiments, the plurality of holes 168 have a diameter of about 0.01 inches to about 0.1 inches. In some embodiments, the plurality of holes includes about 200 to about 350 holes.

Figure 3:
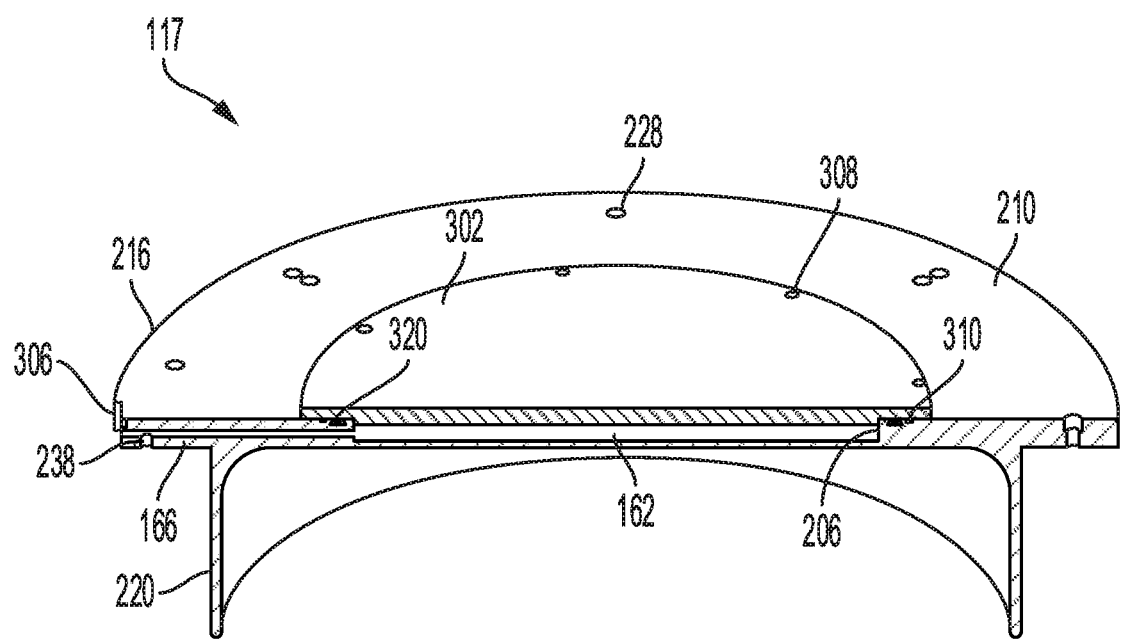
FIG. 3 depicts an isometric cross-sectional view of a process kit in accordance with at least some embodiments of the present disclosure.

FIG. 3 depicts an isometric view of a process kit in accordance with at least some embodiments of the present disclosure. In some embodiments, a cover plate 302 is coupled to the top plate 210 to form a seal along a periphery of the central recess 206 such that the covered recess forms the plenum 162 within the top plate 210. In some embodiments, an o-ring 310 is disposed in the first annular recess 224 to form the seal along the periphery of the central recess 206. In some embodiments, the RF gasket 320 is disposed in the second annular recess 234 to maintain electrical connection between the top plate 210 and the cover plate 302. The cover plate 302 may be made of a metal, for example, aluminum. The cover plate 302 may be a circular disk. In some embodiments, the cover plate 302 includes a plurality of mounting holes 308 aligned with the plurality of cover plate holes 232 of the top plate 210 to facilitate coupling the cover plate 302 to the top plate 210. In some embodiments, the outer sidewall 216 of the top plate 210 includes a slot 306 to facilitate coupling a gas line to the channel 166. In some embodiments, the slot 306 may accommodate a plug for sealing the channel 166 at the outer sidewall 216 and direct process gas flow from the second channel 238 into the channel 166 to the plenum 162.

While the foregoing is directed to embodiments of the present disclosure, other and further embodiments of the disclosure may be devised without departing from the basic scope thereof.

The invention claimed is:

1. A process kit for use in a process chamber, comprising:
a top plate having a central recess disposed in an upper surface thereof;
a channel extending from the central recess to an outer sidewall of the top plate to define a first inlet;
a second channel extending from the channel to a lower surface of the top plate to define a second inlet;
a plurality of holes disposed through the top plate from a bottom surface of the central recess to a lower surface of the top plate;
a cover plate configured to be coupled to the top plate and to form a seal along a periphery of the central recess to define a plenum within the top plate; and
a tubular body extending down from the lower surface of the top plate and surrounding the plurality of holes, the tubular body further configured to surround a substrate support, wherein a radially outer surface of the cover plate is disposed radially inward of the tubular body, and wherein a gas flow path extends from the channel to the plenum, through the plurality of holes, and into a volume within the tubular body.

2. The process kit of claim 1, wherein the upper surface of the top plate includes a first annular recess to accommodate an o-ring configured to form the seal along the periphery of the central recess.

3. The process kit of claim 2, wherein the top plate includes a plurality of first mounting holes disposed radially outward of the tubular body and a plurality of second mounting holes disposed radially outward of the plurality of first mounting holes, wherein the first and second mounting holes are configured to mount the top plate to an adapter.

4. The process kit of claim 2, wherein the upper surface of the top plate includes a second annular recess proximate the first annular recess and radially inward of the tubular body, and further comprising an RE gasket disposed in the second annular recess.

5. The process kit of claim 1, wherein the plurality of holes have a diameter of about 0.01 inches to about 0.1 inches.

6. The process kit of claim 1, wherein the channel extends horizontally from an outer sidewall of the top plate to sidewalls of the central recess, wherein the sidewalls are disposed radially inward of the tubular body.

7. The process kit of claim 1, wherein a lower surface of the top plate is substantially flat.

8. The process kit of claim 1, wherein the process kit is made of aluminum.

9. The process kit of claim 1, wherein the plurality of holes are arranged along a plurality of concentric circles.

10. The process kit of claim 1, wherein the plurality of holes are arranged along three concentric circles, wherein a radially innermost concentric circle has a diameter of about 3.0 inches to about 5.0 inches, and wherein a radially outermost concentric circle 260 has a diameter of about 10.0 inches to about 13.0 inches.

11. A process kit for use in a process chamber, comprising:
a top plate having a central recess disposed in an upper surface thereof, wherein the upper surface of the top plate includes a first annular recess to accommodate an o-ring configured to form a seal along a periphery of the central recess and a second annular recess proximate the first annular recess;
a cover plate coupled to the top plate and configured to cover the central recess to define a plenum;
an RF gasket disposed in the second annular recess;
a channel extending from an outer portion of the top plate to sidewalls of the central recess, wherein an outer sidewall of the top plate includes a slot extending radially inward from an outer sidewall of the top plate to a radially inner sidewall of the top plate, and wherein the channel extends radially inward from a port opening in the radially inner sidewall to the plenum;
a plurality of holes disposed through the top plate from a bottom surface of the central recess to a lower surface of the top plate, wherein the plurality of holes are arranged along a plurality of concentric circles; and
a tubular body extending down from the lower surface of the top plate at a location radially outward of the second annular recess and surrounding the plurality of holes, the tubular body further configured to surround a substrate support, wherein sidewalls of the tubular body do not include any through holes, wherein sidewalls of the central recess are disposed radially inward of the tubular body, and wherein a gas flow path extends from the channel to the central recess, through the plurality of holes, and into a volume within the tubular body.

12. The process kit of claim 11 further comprising:
an annular ring configured to surround the substrate support; and
an annular lip extending from an upper surface of the annular ring, wherein the annular ring includes a plurality of ring slots extending through the annular ring and disposed at regular intervals along the annular ring, and wherein the annular lip includes a plurality of lip slots extending horizontally through the annular lip disposed at regular intervals along the annular lip, wherein the plurality of lip slots overlap horizontally with the tubular body, and the annular ring overlaps vertically with the tubular body.

13. The process kit of claim 11, wherein the upper surface of the top plate includes an annular recess radially outward of the central recess to accommodate an o-ring between the top plate and the cover plate.

14. The process kit of claim 11, wherein the channel extends from the lower surface of the top plate to the central recess.

15. The process kit of claim 11, wherein the plurality of holes includes about 200 to about 350 holes.

16. The process kit of claim 11, wherein the port opening defines a first inlet, and further comprising a second channel extending from a second inlet at a lower surface of the top plate to the channel.

17. A process chamber, comprising:
a chamber body defining an interior volume and having a pump port;
an adapter disposed on sidewalls of the chamber body;
a substrate support disposed in the interior volume;
the process kit of claim 1; and
a pump coupled to the pump port and configured to remove particles from the interior volume through a gap between the tubular body and the substrate support.

18. The process chamber of claim 17, further comprising a lower shield comprising and annular ring configured to surround the substrate support and an annular lip extending from an upper surface of the annular ring, wherein the annular ring includes a plurality of ring slots, and wherein the annular lip includes a plurality of lip slots.

19. The process chamber of claim 17, wherein the substrate support comprises a pedestal having an electrostatic chuck, wherein the electrostatic chuck includes a gas channel extending through the electrostatic chuck and configured to flow a process gas to an upper surface of the electrostatic chuck.

* * * * *